US011437249B2

(12) United States Patent
Blomberg et al.

(10) Patent No.: US 11,437,249 B2
(45) Date of Patent: Sep. 6, 2022

(54) SHOWERHEAD DEVICE FOR SEMICONDUCTOR PROCESSING SYSTEM

(71) Applicant: ASM IP Holding B.V., Almere (NL)

(72) Inventors: Tom E. Blomberg, Vantaa (FI); Varun Sharma, Maunula (FI)

(73) Assignee: ASM IP HOLDING B.V., Almere (NL)

(*) Notice: Subject to any disclaimer, the term of this patent is extended or adjusted under 35 U.S.C. 154(b) by 0 days.

(21) Appl. No.: 16/930,800

(22) Filed: Jul. 16, 2020

(65) Prior Publication Data

US 2021/0020468 A1 Jan. 21, 2021

Related U.S. Application Data

(60) Provisional application No. 62/875,909, filed on Jul. 18, 2019.

(51) Int. Cl.

| C23C 16/40 | (2006.01) |
|---|---|
| H01L 21/67 | (2006.01) |
| H01L 21/3065 | (2006.01) |
| H01J 37/32 | (2006.01) |
| C23C 16/455 | (2006.01) |
| C23C 16/44 | (2006.01) |

(52) U.S. Cl.
CPC .... H01L 21/67063 (2013.01); C23C 16/4412 (2013.01); C23C 16/45559 (2013.01); H01J 37/3244 (2013.01); H01L 21/3065 (2013.01)

(58) Field of Classification Search
CPC ........... H01L 21/67063; H01L 21/3065; H01L 21/6708; H01L 21/67017; H01L 21/67207; C23C 16/45559; C23C 16/4412; H01J 37/3244; H01J 37/32357; H01J 37/32449

USPC ....................................... 118/715; 156/345.1
See application file for complete search history.

(56) References Cited

U.S. PATENT DOCUMENTS

| 7,537,662 | B2 | 5/2009 | Soininen et al. |
| 7,911,001 | B2 | 3/2011 | Lee et al. |
| 8,632,687 | B2 | 1/2014 | Auth et al. |
| 8,869,742 | B2 | 10/2014 | Dhindsa et al. |
| 9,132,436 | B2 * | 9/2015 | Liang ............... C23C 16/45561 |

(Continued)

FOREIGN PATENT DOCUMENTS

| JP | H05206088 | 8/1993 |
| JP | H08176851 | 7/1996 |

(Continued)

OTHER PUBLICATIONS

"Chemicals Used in Chip Fabrication," GAPS Guidelines GAP.17.1.1.B, Global Asset Protection Services LLC, 2015, pp. 1-4.

(Continued)

*Primary Examiner* — Rudy Zervigon
(74) *Attorney, Agent, or Firm* — Knobbe, Martens, Olson & Bear LLP

(57) ABSTRACT

To create constant partial pressures of the by-products and residence time of the gas molecules across the wafer, a dual showerhead reactor can be used. A dual showerhead structure can achieve spatially uniform partial pressures, residence times and temperatures for the etchant and for the by-products, thus leading to uniform etch rates across the wafer. The system can include differential pumping to the reactor.

20 Claims, 7 Drawing Sheets

(56) References Cited

U.S. PATENT DOCUMENTS

| | | | |
|---|---|---|---|
| 9,184,028 B2 | 11/2015 | Dhindsa et al. | |
| 9,257,638 B2 | 2/2016 | Tan et al. | |
| 9,396,956 B1 | 7/2016 | Fukazawa | |
| 9,425,041 B2 | 8/2016 | Berry et al. | |
| 9,637,823 B2 | 5/2017 | Knoops et al. | |
| 10,283,319 B2 | 5/2019 | Blomberg et al. | |
| 2002/0160125 A1* | 10/2002 | Johnson | H01L 21/31116 427/569 |
| 2004/0216668 A1* | 11/2004 | Lindfors | C23C 16/45574 118/715 |
| 2005/0103265 A1* | 5/2005 | Gianoulakis | C23C 16/4412 118/715 |
| 2008/0318417 A1* | 12/2008 | Shinriki | H01L 21/28556 438/650 |
| 2014/0273492 A1 | 9/2014 | Anthis | |
| 2015/0218695 A1 | 8/2015 | Odedra | |
| 2016/0307764 A1 | 10/2016 | Gupta et al. | |
| 2016/0308112 A1 | 10/2016 | Tan et al. | |
| 2016/0329221 A1 | 11/2016 | Berry et al. | |

FOREIGN PATENT DOCUMENTS

| | | |
|---|---|---|
| JP | 2004-063633 | 2/2004 |
| TW | 201525173 | 7/2015 |
| TW | 201608662 | 3/2016 |
| WO | WO 2015/160412 | 10/2015 |
| WO | WO 2016/100873 | 6/2016 |
| WO | WO 2016/172740 | 10/2016 |
| WO | WO 2017/099718 | 6/2017 |
| WO | WO 2017/205658 | 11/2017 |
| WO | WO 2017/213842 | 12/2017 |
| WO | WO 2018/106955 | 6/2018 |

OTHER PUBLICATIONS

"Inorganic Analysis," Analyst, 1921,46, pp. 157-161.
"Safetygram #25", Air Products and Chemicals, Inc., 2004 in 8 pages.
"SO3 Gas-Phase Cleaning Process," Final Report, ANON Inc., San Jose, California, 1999, in 19 pages.
"Insights for Electronics Manufacturing", Solid State Technology, Jul. 2016, vol. 59, No. 5, pp. 1-52.
"Xenon Difluoride (XeF2)," Versum Materials, LLC, 2016, in 2 pages.
Barton et al., "The Dissociation of Sulfur Monochloride Vapor," J. Am. Chem. Soc., Feb. 1935, vol. 57 (2), pp. 307-310.
Brandão et al., "Synthesis, Characterization and use of Nb2O5 based Catalysts in Producing Biofuels by Transesterification, Esterification and Pyrolysis," J. Braz. Chem. Soc., 2009, vol. 20, No. 5, pp. 954-966.
Bock et al., "Unstable Intermediates in the Gaseous Phase: The Thermal Decomposition of Acyl Chlorides RCOCl," Angew. Chem. Int. Ed. Engl., 16, (1977) No. 2, pp. 105-107.
Chaiken et al., "Rate of Sublimation of Ammonium Halides," The Journal of Chemical Physics 37, 2311 (1962), in 9 pages.
Chalker, P.R., "Photochemical Atomic Layer Deposition and Etching," Surface & Coatings Technology, 291, (2016), pp. 258-263.
Coman et al., "NbF5—AlF3 Catalysts: Design, Synthesis, and Application in Lactic Acid Synthesis from Cellulose", ACS Catal., 2015, 5 (5), pp. 3013-3026.
Dumont et al., "Competition Between Al2O3 Atomic Layer Etching and AlF3 Atomic Layer Deposition Using Sequential Exposures of Trimethylaluminum and Hydrogen Fluoride." The Journal of Chemical Physics, 146, (2017), pp. 052819-1-052819-10.
Dumont et al., "Thermal Atomic Layer Etching of SiO2 by a "Conversion-Etch" Mechanism Using Sequential Reactions of Trimethylaluminum and Hydrogen Fluoride," ACS Appl. Mater. Interfaces, 2017, 9, pp. 10296-10307.
File History of U.S. Appl. No. 15/835,272, filed Dec. 7, 2017.
File History of U.S. Appl. No. 16/390,319, filed Apr. 22, 2019.
File History of U.S. Appl. No. 16/881,868, filed May 22, 2020.
File History of U.S. Appl. No. 15/835,212, filed Dec. 7, 2017.
File History of U.S. Appl. No. 16/390,385, filed Apr. 22, 2019.
File History of U.S. Appl. No. 16/881,718, filed May 22, 2020.
File History of U.S. Appl. No. 15/835,262, filed Dec. 7, 2017.
File History of U.S. Appl. No. 16/390,540, filed Apr. 22, 2019.
File History of U.S. Appl. No. 16/881,885, filed May 22, 2020.
File History of U.S. Appl. No. 16/930,867, filed Jul. 16, 2020.
Jackson et al., "Optimizing AlF3 Atomic Layer Deposition Using Trimethylaluminum and TaF5: Application to High Voltage Li-ion Battery Cathodes," Journal of Vacuum Science & Technology A 34, 2016, pp. 031503-1-031503-8.
Johnson et al., Thermal Atomic Layer Etching of Crystalline Aluminum Nitride Using Sequential, Selflimiting Hydrogen Fluoride and Sn(acac)2 Reactions and Enhancement by H2 and Ar.
Johnson et al., "WO3 and W Thermal Atomic Layer Etching Using "Conversion Fluorination" and "Oxidation-Conversion-Fluorination" Mechanisms", ACS Appl. Mater. Interfaces, 2017, 9, pp. 34435-34447.
Huardyiting Zhang, et al., "Atomic Layer Etching of 3D Structures in Silicon: Self-limiting and Nonideal Reactions," Journal of Vacuum Science & Technology A, 2017, p. 031306-1-031306-15.
Kanarik et al., "Overview of Atomic Layer Etching in the Semiconductor Industry," Journal of Vacuum Science & Technology A: Vacuum, Surfaces, and Films 33, 2015, p. 020802-1-020802-14.
Kastenmeier et al., "Remote Plasma Etching of Silicon Nitride and Silicon Dioxide Using NF3/02 Gas Mixtures," Journal of Vacuum Science & Technology A, 1998, pp. 2047-2056.
Kastenmeier et al., "Surface Etching Mechanism of Silicon Nitride in Fluorine and Nitric Oxide Containing Plasmas," Journal of Vacuum Science & Technology A, 2001, pp. 25-30.
Kepten, et al., "Studies of the Possible Reaction of WF6 with SiO2 and Si3N4 at Several Temperatures." J. Electrochem. Soc., vol. 139, No. 8, Aug. 1992, pp. 2331-2337.
Knapas et al., "Etching of Nb2O5 Thin Films by NbCl5", Chemical Vapor Deposition, 2009, vol. 15, pp. 269-273.
Kohli et al., "Methods for Removal of Particle Contaminants," Developments in Surface Contamination and Cleaning, vol. 3, 2011, in 259 pages.
Kuhle, Engelbert, "One Hundred Years of Sulferic Acid Chemistry, 11b. Substitution and Cyclization Reactions of Sulfenyl Halides", Dec. 1971, pp. 617-638.
Lee et al., "Atomic Layer Etching of HfO2 Using Sequential, Self-Limiting Thermal Reactions with Sn(acac)2 and HF", ECS Journal of Solid State Science and Technology, 4 (6), 2015, pp. N5013-N5022.
Lee et al., "Atomic Layer Etching Al2O3 Using Sequential, Self-Limiting Thermal Reactions with Sn(acac)2 and Hydrogen Fluoride", ACS Nano, 9 (2), 2015, pp. 2061-2070.
Lee et al., "Selectivity in Atomic Layer Etching Using Sequential, Self-Limiting Thermal Reactions," ACS Nano 9, 2061, 2015, in 29 pages.
Lee et al., "Thermal Atomic Layer Etching of Titanium Nitride Using Sequential, Self-Limiting Reactions: Oxidation to TiO2 and Fluorination to Volatile TiF4", Chem. Mater., 2017, 29, pp. 8202-8210.
Lenher, Victor, "Some Properties on Selenium Oxychloride", Contribution from the Department of Chemistry, University of Wisconsin, May 26, 1922, pp. 1664-1667.
Luna, Adolfo E. Castro, "Vapor Pressure of WOCl4", J. Chem. Eng. Data, 1983, 28, p. 349.
McDonald et al., "Corrosion of Steel and Nickel Alloys in Neutral and Acidic Solutions of Thionyl Chloride and Sulfuryl Chloride," Journal of the Electrochemical Society, Jun. 1988, pp. 1313-1316.
Michalski et al., "A New Approach towards Organophosphorus Sulfenyl and Selenyl Halides, Phosphorus and Sulfur and the Related Elements", 30:1-2, Jan. 3, 2007, pp. 221-224.
Nieder-Vahrenholz, et al., "Die Oxidfluoride des Niobs und Tantals", Journal of Inorganic and General Chemistry, Zeitschrift fur anorganische Chemie, vol. 544, 1, Jan. 1987, pp. 122-126.
Oehrlein, et al., "Atomic Layer Etching at the Tipping Point: An Overview", ECS Journal of Solid State Science and Technology, 4 (6), Mar. 27, 2015, pp. N5041-N5053.

(56) References Cited

OTHER PUBLICATIONS

Painter, Edgar Page, "The Chemistry and Toxicity of Selenium Compounds, with Special Reference to the Selenium Problem," Chem. Rev., Apr. 1941, 28 (2), pp. 179-213.

Pop et al., "New Group 11 Complexes with Metal-Selenium Bonds of Methyldiphenylphosphane Selenide: A Solid State, Slution and Theoretical Investigation," Dalton Trans., 2011, 40, p. 12479-12490.

Rivillon et al., "Chlorination of Hydrogen-Terminated Silicon (111) Surfaces," J. Vac. Sci. Technol. A 23, Jul./Aug. 2005, pp. 1100-1106.

Shinoda et al., "Thermal Cyclic Etching of Silicon Nitride Using Formation and Desorption of Ammonium Fluorosilicate," Applied Physics Express 9, 2016, pp. 106201-1-106201-3.

Société chimique de France. Auteur du texte, "Bulletin de la Socit chimique de Paris", L. Hachette; Masson, 1871, p. 47.

Sprenger et al., "Electron-enhanced atomic layer deposition of silicon thin films at room temperature", J. Vac. Sci. Technol. A 36(1), Jan./Feb. 2018, pp. 01A118-1-01A118-10.

Suresh B.S., et al., "A Study of the Reaction of Silicon Tetrahalides with Phosphorus Pentoxide and of Alkali Metal Fluorosilicates with Phosphorus Pentoxide and Sulphur Trioxide," Journal of Fluorine, 24, 1984, pp. 399-407.

Svistunova, I.V., "Boron Difluoride Acetylacetonate Sulfenyl (Selenyl) Halides," Russian Journal of General Chemistry, 2010, vol. 80, No. 12, pp. 2430-2437.

Vallée, et al., "Selective Deposition Process Combining PEALD and ALE ex: Ta2O5 and TiO2," Powerpoint presentation at the 2017 ALD Conference, in 53 pages.

\* cited by examiner

SHOWERHEAD DEVICE FOR SEMICONDUCTOR PROCESSING SYSTEM

INCORPORATION BY REFERENCE TO ANY PRIORITY APPLICATIONS

This application claims priority to U.S. Provisional Patent Application No. 62/875,909 filed Jul. 18, 2019, the contents of which are incorporated by reference herein in their entirety and for all purposes.

BACKGROUND

Field

The field relates generally to a showerhead device for a semiconductor processing system.

Description of the Related Art

Vapor deposition processes such as atomic layer deposition (ALD) are well-known. ALD processes typically utilize alternating and sequential supply of vapor-phase reactants to a substrate to deposit up to a layer of material in a controlled and highly-conformal manner, where efficient removal of reactants between pulses is important to minimize undesired reactions in the gas phase. Thin films deposited by ALD are used in a wide variety of applications, such as in the formation of integrated circuits. Controlled removal of materials is also highly desirable. An example process that controllably removes materials to define circuitry and other structures is chemical vapor etching (CVE) or atomic layer etching (ALE). Some CVE processes employ a pulsed supply of etchants. For example, in some etch processes, sequential pulses of vapor phase reactants can remove minute amounts of material from a substrate in a controlled and/or selective manner.

SUMMARY

According to one aspect, a semiconductor processing apparatus is disclosed. The apparatus can comprise: a reaction chamber and a first exhaust port, the first exhaust port being configured to remove vapors from the reaction chamber. The apparatus can also comprise a showerhead device that is connected to the reaction chamber and being configured to deliver reactant vapors to the reaction chamber. The showerhead device can comprise: a gas inlet that is configured to supply the reactant vapors into the showerhead device; a first showerhead plate in fluid communication with the gas inlet, the first showerhead plate comprising a plurality of openings; and a second showerhead plate comprising: a plurality of inlet ports in fluid communication with the plurality of openings, the plurality of inlet ports configured to deliver the reaction vapors to the reaction chamber; and a plurality of second exhaust ports configured to remove vapors from the reaction chamber. The apparatus can also comprise one or more pumps connected to the first exhaust port and the plurality of second exhaust ports, the one or more pumps being configured to remove vapors from the reaction chamber through the first exhaust port and the plurality of second exhaust ports.

According to one aspect, a semiconductor processing apparatus is disclosed. The apparatus can comprise: a reaction chamber; a reaction chamber exhaust port being configured to remove vapors from the reaction chamber; and a showerhead device that comprises: a plurality of distributed inlet apertures in fluid communication with a reaction vapor source and the reaction chamber; and a plurality of distributed exhaust apertures in fluid communication with a pump and the reaction chamber.

According to one aspect, a method for etching a substrate is disclosed. The method can comprise supplying a reactant vapor to a showerhead device; conveying the reactant vapor to a reaction chamber through a plurality of distributed inlet apertures in the showerhead device; removing vapors from the reaction chamber by way of a first exhaust port exposed to the reaction chamber; and removing vapors from the reaction chamber by way of a plurality of second exhaust ports in the showerhead device.

BRIEF DESCRIPTION OF THE DRAWINGS

These and other features, aspects and advantages of the present invention will now be described with reference to the drawings of several embodiments, which embodiments are intended to illustrate and not to limit the invention.

DETAILED DESCRIPTION

Figure 1:
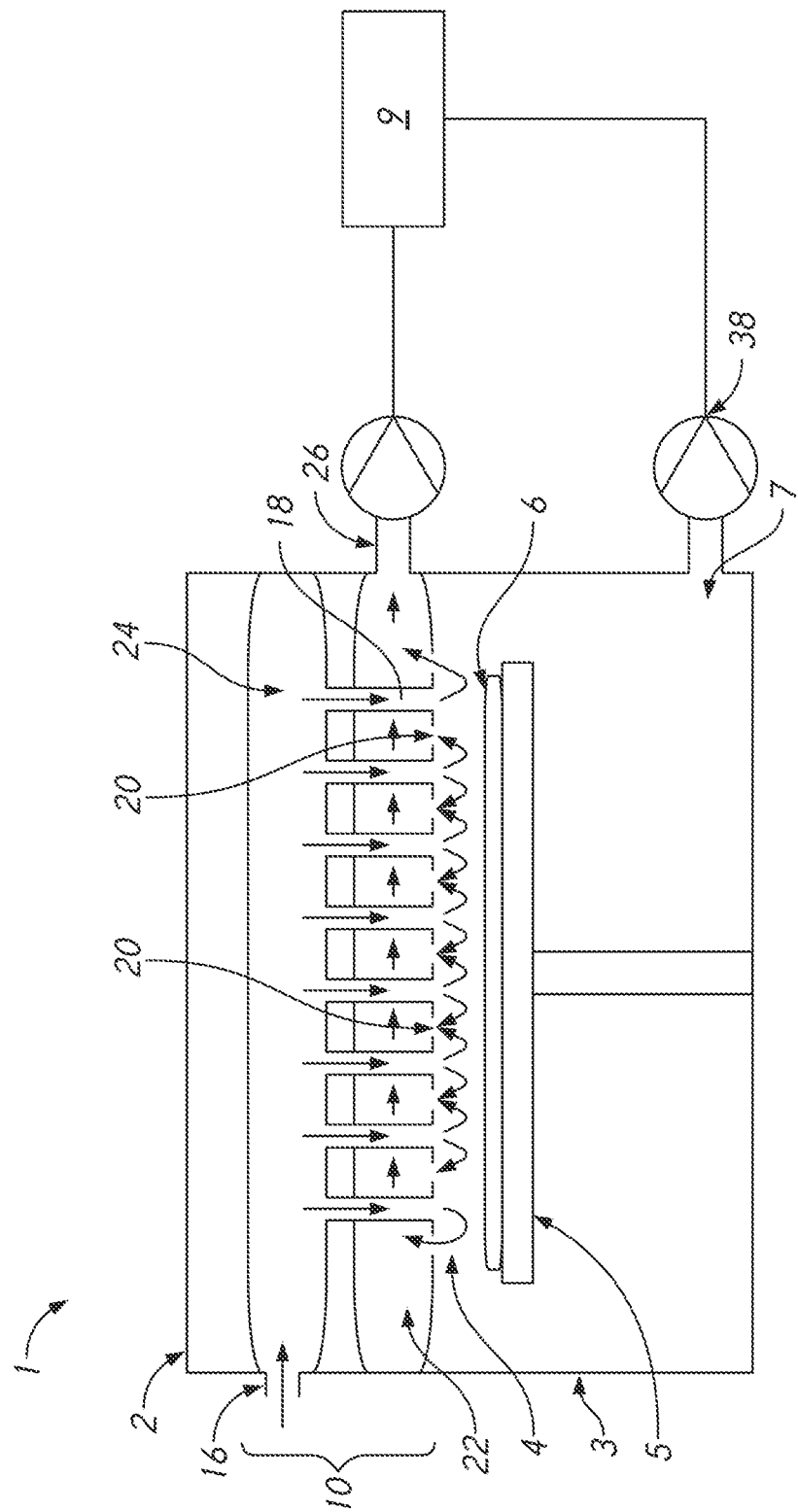
FIG. 1 illustrates a schematic side view of a reactor with a dual showerhead device in accordance with some embodiments.

Chemical etching of microelectronics materials may have benefits over plasma etching. However, in order to provide uniform etch rates across the wafer, the partial pressures, residence times and temperatures of an etch reactant (such as an adsorbing reactant and/or an etchant) and by-products should not significantly vary spatially above the substrate (such as a wafer). Showerhead type reactors can provide uniform distribution of the partial pressure of the incoming gas, but the partial pressures of the by-products and residence time of the gas molecules may not be constant across the wafer. For example, the molecules entering from the center of the showerhead have longer residence times in the reactor compared to the molecules entering from the edge of the wafer, because pumping to exhaust from the reaction chamber is normally done from the perimeter of the wafer.

Various embodiments disclosed herein can be used in etching processes (e.g., CVE processes). Any suitable etch chemistries can be used in the disclosed embodiments. As one example, the process can involve one or more etching cycles, where each cycle exposes a substrate to a first vapor-phase halide reactant having a first halide ligand to form adsorbed species on the substrate surface and subsequently exposing the substrate to a second vapor-phase halide reactant having a second halide ligand that converts the adsorbed species into volatile species such that at least some material is removed from the film. In various embodiments, the film can include W, TiN, $TiO_2$, TaN, SiN, $AlO_2$, $Al_2O_3$, $ZrO_2$, $WO_3$, SiOCN, SiOC, SiCN, AlN or $HfO_2$. The first vapor-phase halide can be a metal halide, such as Nb, Ta, Mo, Sn, V, Re, Te, W, and group 5 and 6 transition metals. The second vapor-phase halide can be a carbon-based halide, such as $CCl_4$ or $CBr_4$. Further examples of various etch chemistries and processes that can be used in conjunction with the disclosed embodiments can be found throughout International Application No. PCT/US2017/065170, which is incorporated by reference herein in its entirety and for all purposes.

To create constant partial pressures of the by-products and uniform residence times of the gas molecules across the substrate, a dual showerhead reactor can be used. A dual showerhead structure can achieve spatially uniform partial pressures, residence times and temperatures both for the etch reactants and for the by-products, thus leading to a uniform etch rate across the wafer. This apparatus can be used either in steady state partial pressure mode, in partial pressure pulsing mode, or in total pressure pulsing mode, or combinations thereof, depending upon which mode is preferred to achieve desired etching conformality for the substrate.

Furthermore, this apparatus can be integrated with differential pumping to the reactor. It is possible to tune the residence time distributions and partial pressure profiles within the reactor, and therefore, the etching profile of the substrate (e.g., wafer) by modulating the pumping speed and conductances of the showerhead device and reaction chamber. For example, the apparatus can be used in a steady state mode (e.g., constant etch reactant, for example etchant, flow) or a partial pressure pulsing mode (e.g., pulsing etchant flow while keeping the total pressure constant), a pressure pulsing mode (e.g., constant etchant flow, pulsing total pressure) or a total pulsing mode (e.g., pulsing partial pressure and total pressure) or combinations thereof. Pulsing mode and pumping mode may determine the partial pressure and residence time distributions of etchant gas above the wafer in dynamic flow conditions, and therefore, the conformality and uniformity of the etch process can be controlled.

In various embodiments, the etch conformality of etch processes used in conjunction with the disclosed embodiments can be: greater than 50%; greater than 80%; greater than 90%; greater than 95%; greater than 98%; or greater than 99%. In some embodiments, etch selectivity can also be controlled. Etch selectivity can be given as a percentage, calculate by [(etched material on surface A)−(etched material on surface B)]/(etched material on surface A). The etch amount can be measured in a variety of ways. For example, etch amount may be given as the measured reduced thickness of the etched material, or may be given as the measured amount of material etched based on comparisons of what was originally present and what was left after the etch process. In some embodiments, selectivity for the etch process is greater than about 10%, greater than about 50%, greater than about 75%, greater than about 85%, greater than about 90%, greater than about 93%, greater than about 95%, greater than about 98%, greater than about 99% or greater than about 99.5%. In some embodiments, the aspect ratio of the etched features can be greater than about: 2:1, 3:1, 5:1, 10:1, 20:1, 40:1, or 100:1.

For example, the first, upper chamber of the showerhead device can have continuous flow, and the second, bottom reaction chamber can have continuous pumping with leaching out of the reaction by-product and precursor to reduce pressure spikes. The bottom reaction chamber can supply constant partial pressure within the precursor exposure times.

FIG. 1 illustrates semiconductor processing apparatus 1 that includes a reactor 2 with a dual showerhead device 10. The reactor 2 includes a reaction chamber 3 that has an interior portion 4 between the susceptor 5 and the showerhead device 10. Within the reactor 2 and attached to the chamber 3 is a susceptor plate 5. The susceptor plate 5 extends upwardly from the base of the chamber 3. The susceptor plate 5 supports the substrate 6 (e.g., wafer) during processing. The dual showerhead device 10 can be disposed over the susceptor 5 and substrate 6. Although not shown, a gas manifold can supply reactant and inactive gases to the showerhead device 10, which can disperse the supplied gases across the width of the substrate 6 to etch material. The inlet manifold 11 can be fluidly connected to a reactant source, such as a source of etch reactant, e.g., an etchant or adsorbing reactant (see, e.g. FIG. 2). The etchant source may be a gas bomb, and/or may include a vaporization device for vaporizing etchant chemicals that are naturally liquid or solid.

In some embodiments, the dual showerhead 10 can include a plurality of gas inlets 18 (apertures) and a plurality of gas outlets 20 (apertures) or exhaust ports. The inlet 18 and outlet apertures 20 may not be in direct communication with one another but can both fluidly communicate directly with the reaction chamber 3 below them. In some embodiments, a second gas outlet line 26 or exhaust port can provide fluid communication directly with the reaction chamber 3 to remove gases from the reaction chamber 3. As demonstrated in FIG. 1, reactant gas (e.g., an etch gas) can enter into the dual showerhead device 10 at the gas inlet(s) 16 into an upper plenum 24 and flow towards the susceptor plate 5 holding a wafer 6. The dual showerhead's 10 gas outlet apertures 20 remove vapors from the chamber 3 through a pump 9 connected to an internal, or lower, showerhead plenum 22. The second gas outlet line 26 can also be utilized to remove vapors through the pump 9. In some embodiments, the same pump 9 can be used with both gas outlet lines 20, 26. In other embodiments, both gas outlets 20, 26 have a separate pump 9 connected to each of the gas outlet lines 20, 26. In some embodiments, a valve 38 is connected to each gas outlet line 20, 26 and works in tandem with a pump 9 to control the flow of gas out of the reactor chamber 3.

Thus, in the embodiment of FIG. 1, the semiconductor processing apparatus 1 can include a reaction chamber 3 and a reaction chamber exhaust port 7 configured to remove vapors from the reaction chamber 3. The showerhead device 10 can include a plurality of distributed inlet apertures 18 in fluid communication with a reactant vapor source and the reaction chamber 3. The showerhead device 10 can include a plurality of distributed exhaust apertures 20 in fluid communication with a pump 9 and the reaction chamber 3. The same or different pumps 9 may connect to the showerhead 10 and the reaction chamber 3. In the illustrated embodiment, an internal plenum 22 within a lower portion 14 of the showerhead 10 (e.g., defined between two plates) can communicate with the pump 9. The inlet apertures 18 can extend through the showerhead device 10 and can bypass the internal plenum 22 in some embodiments. The inlet apertures 18 can communicate with an upper plenum 24, above the lower portion 14 of the showerhead 10. FIG. 1 shows a simple side gas inlet 16 communicating with the upper plenum 24. However, as will be better understood from the description below of FIGS. 2-3C, the upper plenum 24 can instead communicate with an inlet manifold distributing reactant vapors across the upper plenum 24.

One or a plurality of pumps 9 can draw residue gases from the exhaust ports 20 in the showerhead device 10 and from the reaction chamber 3 exhaust port 7. In some embodiments, the pumping speed of gases through the reaction chamber 3 exhaust port 7 in the showerhead device 10 can vary from about 25 $m^3/h$ to about 5000 $m^3/h$., with the pump 9 speeds being between about 50 $m^3/h$ and about 2500 $m^3/h$ in some embodiments, for example, between about 100 $m^3/h$ and about 2000 $m^3/h$. In some embodiments, the pumping speed of gases through the reaction chamber 3 exhaust port 7 in the reaction chamber 3 can vary from about 25 $m^3/h$ to about 5000 $m^3/h$, with the pump speeds being between about 50 $m^3/h$ and about 2500 $m^3/h$, for example, between about 100 $m^3/h$ and about 2000 $m^3/h$. In various embodiments, the pump speeds (or valves 38 in communication with a common pump 9) can be modulated to draw different flow rates of exhaust gases from the showerhead device 10 and the reaction chamber 3 exhaust port 7. In some embodiments, the ratio of the pumping speed of gases through the exhaust ports 20 in the showerhead device 10 to the pumping speed of gases through the reaction chamber 3 exhaust port 7 in the reaction chamber 3 can be in a range of 100:1 to 1:100, in a range of 50:1 to 1:50, in a range of 10:1 to 1:10, in a range of 5:1 to 1:5, in a range of 2:1 to 1:2, or in a range of 1.5:1 to 1:1.5. By adjusting the pumping speeds, the etch process can be modulated. Beneficially, the differential pumping systems and techniques disclosed herein and shown in FIG. 1 can improve the uniformity and conformality of etching techniques.

In various embodiments disclosed herein, the modulation of residence time of gaseous or plasma species can be used in plasma etching reactors. Thus, in some embodiments, the apparatus 1 can be used with plasma etching reactors. For example, for RF plasma reactors, as is known in the art, a remote plasma can be formed within the showerhead 10 (the upper 12 and lower portions 14 of the showerhead 10 serving as plasma electrodes), or in situ within the reaction chamber 3 (the showerhead device 10 and the susceptor 5 and/or reaction chamber 3 walls serving as plasma electrodes). The embodiments disclosed herein can also be applied in modulating the plasma itself. In other embodiments, the apparatus 1 disclosed herein can be used in etching reactors that are not plasma etch reactors, and/or in reactors that are not used for deposition processes.

In various embodiments, a throttle valve can be provided to regulate the pump(s) 9 to modulate the residence time by tuning effective pumping speeds and/or by using a showerhead device 10 with appropriate values of x, the spacing between the inlet 18 and outlet apertures 20 of the showerhead device 10. In various embodiments, the residence time of gas molecules can be defined as $\tau$, with $\tau=v/s$, where v is the volume of reaction space and s is the effective volumetric pumping speed. s can be defined as total effective pumping speed and can be dependent on the number of holes in the showerhead device 10 and the distance x between the inlet 18 and outlet holes 20 of the showerhead device 10. Residence times can describe how long a particular gas species spends inside the reaction space before being pumped out through exhaust lines 26.

Figure 7:
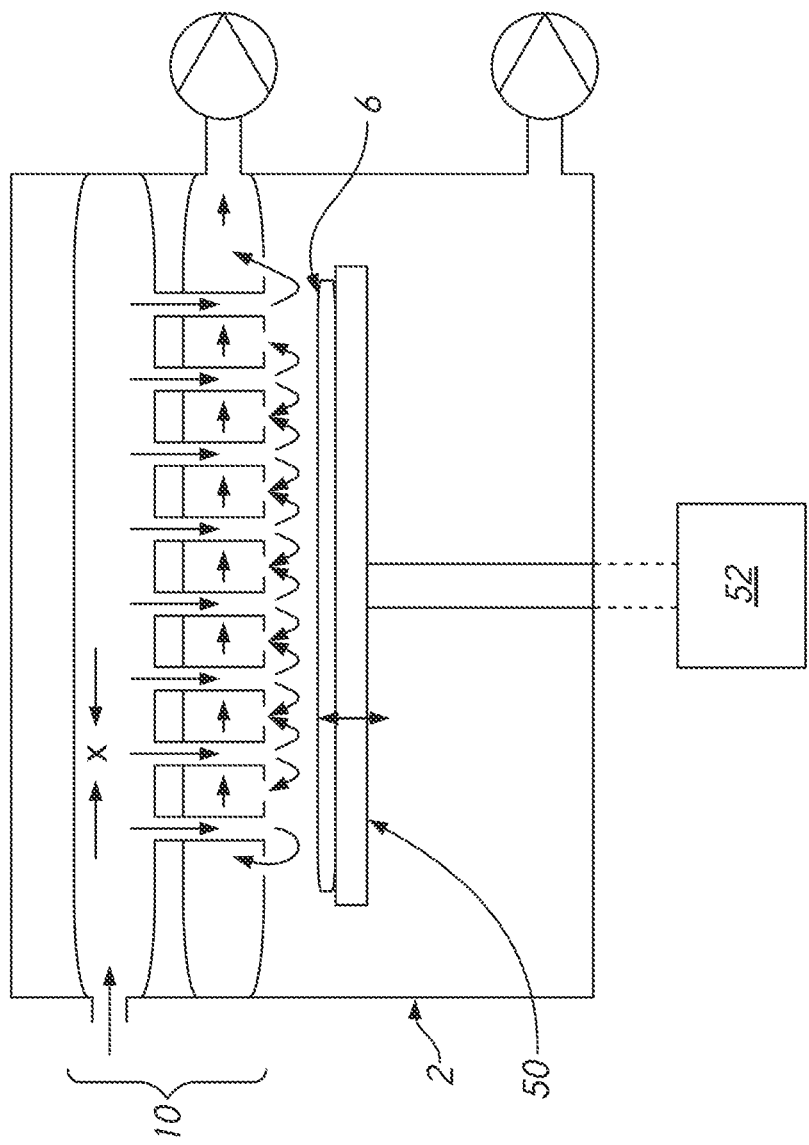
FIG. 7 illustrates a reactor with a dual showerhead and a movable susceptor in accordance with some embodiments.

In some reactors 2 (both plasma as well as thermal etching reactors), the volume of the reaction space may be constant. Various embodiments disclosed herein provide a solution to constant reaction space environment, for example, as shown in FIG. 7. In various embodiments, the residence time can be in a range of 0.1 ms to 10 seconds. For example, the residence time can be in a range of 0.1 ms to 1 ms, 1 ms to 10 ms, 10 ms to 1 s, 1 s to 5 s, 5 s to 10 s, or 5 s to 1 min. The spacing distance x can range from a few millimeters to a few centimeters, for example, in a range of 1 mm to 5 cm, in a range of 1 mm to 1 cm.

Figure 2:
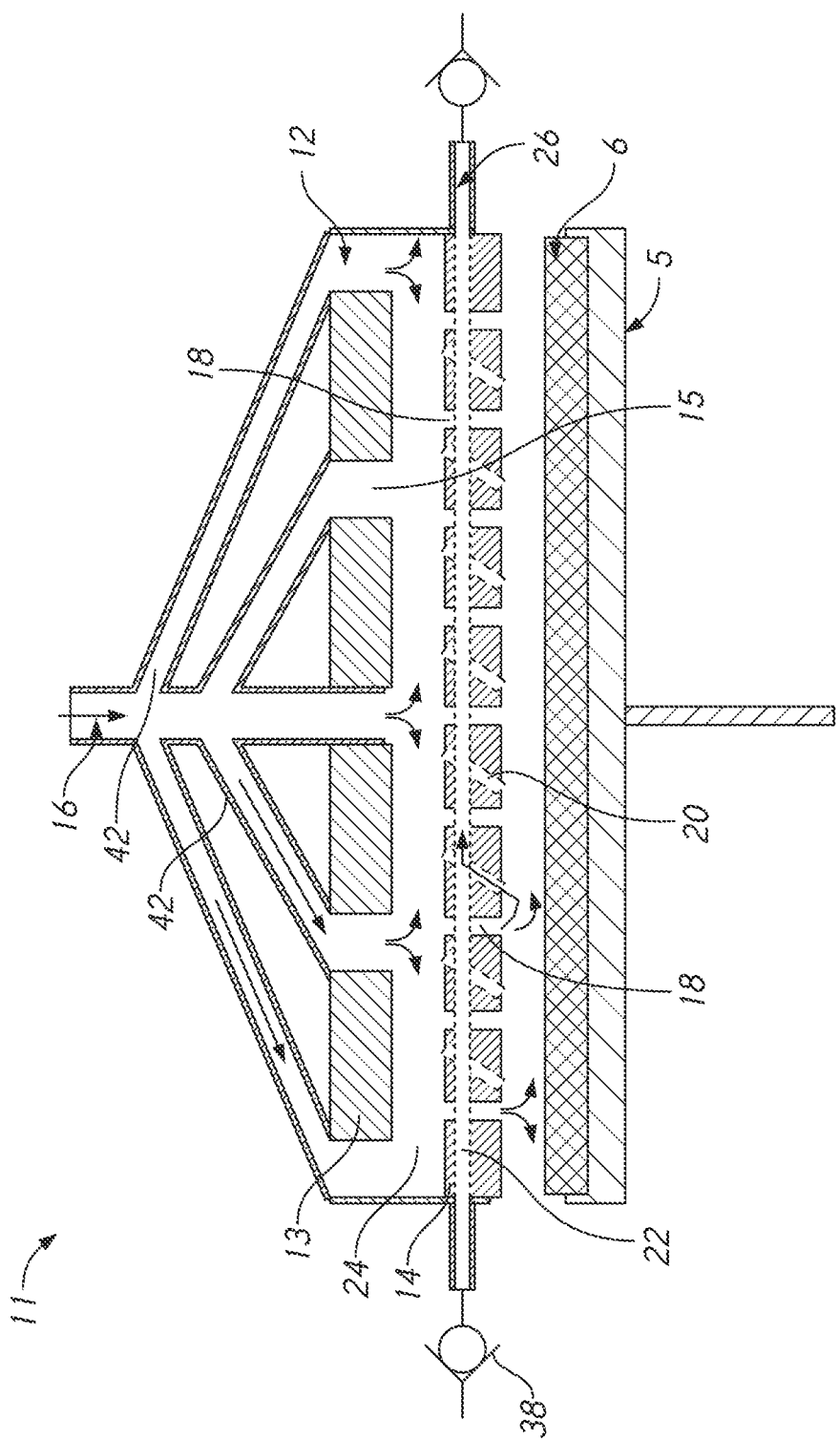
FIG. 2 illustrates a side sectional view of a dual showerhead device in accordance with some embodiments.

FIG. 2 illustrates a sectional view of a semiconductor processing apparatus 1 that includes a dual showerhead device 10 for dispersing gas over a substrate 6 and exhausting, according to various embodiments. In some embodiments, the dual showerhead 10 has an inlet manifold 11 (e.g. a conically shaped top portion) that feeds into an upper portion 12 of the showerhead device 10. The upper portion 12 may include an upper showerhead plate 13 (which can comprise a cylindrical or disc-shaped body) and an upper plenum 24 below it. The upper showerhead plate 13 can be disposed over a second, lower portion 14 of the showerhead device 10. In some embodiments, the inlet manifold 11 and upper showerhead plate 13 can be manufactured separately and joined by welding both components together. In other embodiments, the inlet manifold 11 and the upper showerhead plate 13 can be joined together with mechanical joints. In other embodiments, the dual showerhead 10 can be manufactured from a single piece of material. The connection between the showerhead 10 components can lead to a vacuum or non-vacuum type of sealing. In some embodiments, a space is provided between the upper 12 and lower portions 14 of the showerhead device 10, which creates the upper showerhead plenum 24.

The inlet manifold 11 can be installed near the upper portion 12. The inlet manifold 11 can be connected to a reactant vapor source, which allows reactant gas from a tank or vaporizer to flow into the showerhead device 10 from the inlet manifold 11. Several channels 42 or branches can be formed within the inlet manifold 11 and can be in fluid communication with one or multiple gas inlet apertures 18, such as by way of the upper plenum 24. Reactant vapor entering into the showerhead device 10 through the inlet manifold 11 can travel through the channels 15 defined in the upper showerhead plate 13. In some embodiments, the lower portion 14 of the showerhead device 10 can include both inlet ports 18 (apertures) and outlet or exhaust ports 20 (apertures). The reactant inlet apertures 18 are in fluid communication with the inlet manifold gas channels 42 and gas inlet 16, by way of the upper plenum 24, and as a result, allow the gas to flow from the showerhead device 10 to enter into the reaction chamber 3. In some embodiments, the outlet or exhaust apertures 20 can pull residue gases into the showerhead device 10 through vacuum pressure applied by a vacuum source such as a pump 9. As shown, a reaction chamber gas outlet port 7 can draw gases from the reaction chamber 3 and can be in fluid communication with one or more pumps 9. The gas outlet line 26 can be connected to one or a plurality of pumps 9, which can create a vacuum pressure that draws residue and other gases into the exhaust ports 20 of the showerhead device 10 and into the reaction chamber exhaust port 7. The gas inlet 16 and gas outlet 26 structure of the showerhead device 10, together with the reactant chamber exhaust port 7, can enable the reactor 2 to have spatially uniform partial pressures, residence times, and temperatures for etchant gases and for the by-products thereof.

Figure 3B:
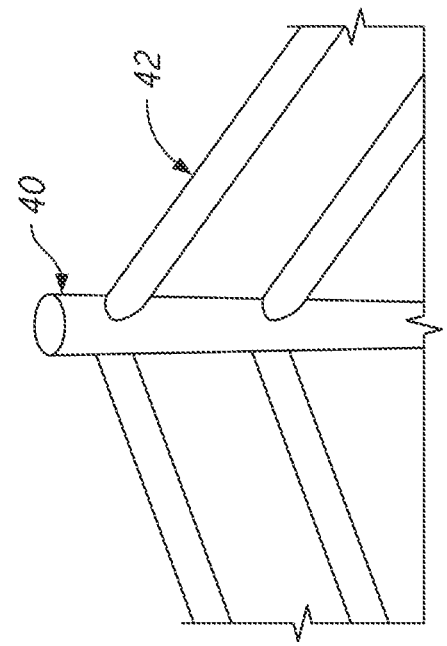
FIG. 3B illustrates a schematic three-dimensional perspective view of the gas inlet of FIG. 3A.
Figure 3A:
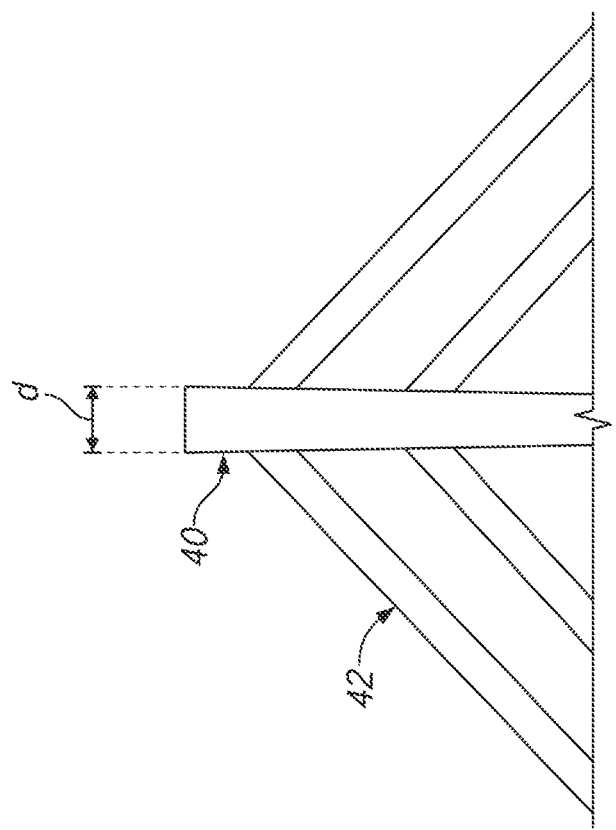
FIG. 3A illustrates a gas inlet for a showerhead device in accordance with some embodiments.
Figure 3C:
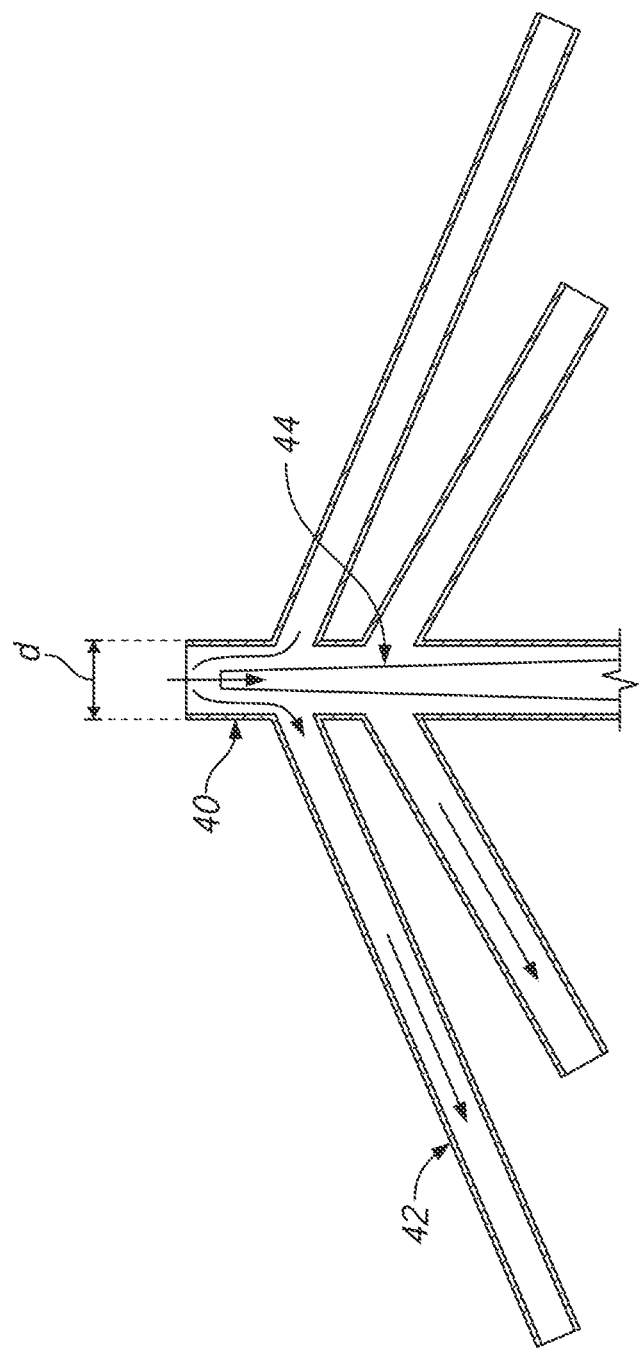
FIG. 3C illustrates the gas inlet of FIG. 3A that includes an insert.

FIGS. 3A-C illustrate various embodiments of a gas inlet manifold 11 above the showerhead device 10. As can be seen in FIG. 3A, the gas inlet manifold 11 can have a main line 40. As can be seen in FIGS. 3A and 3B, the gas channels 42 can branch off the main line 40. The gas channels 42 branch off in multiple direction at multiple points from the main line 40. The main line 40 can have a slightly conical shape, in which the inner diameter d of the main line 40 reduces towards the center of the showerhead. By reducing the inner diameter d towards the center of the showerhead 10, the gas entering into the showerhead 10 through the inlet 16 can travel to each channel 42 in a more uniform manner. In some embodiments, an insert 44 is installed within the main line 40 to bifurcate the flow pathway, as can be seen in FIG. 3C. The insert 44 obstructs flow within the main line 40, causing gas to flow to each branch 42 in a more uniform manner.

Figure 4:
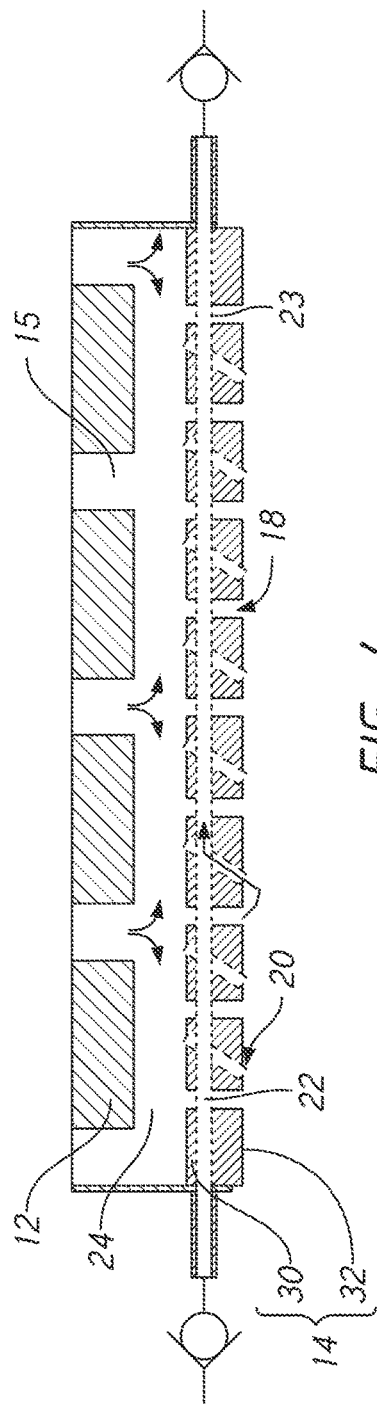
FIG. 4 illustrates a schematic side sectional view of a portion of a dual showerhead device in accordance with some embodiments.
Figure 5:
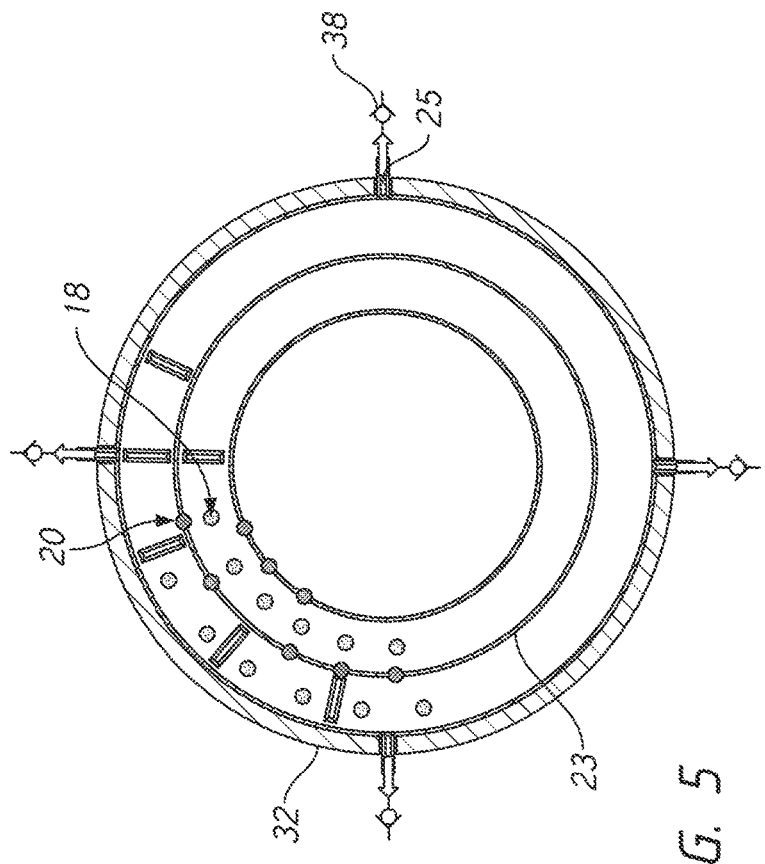
FIG. 5 illustrates an upper plan view of a second showerhead plate of the lower portion of the showerhead device FIG. 4 in accordance with some embodiments.

FIGS. 4 and 5 shows that the lower portion 14 of the showerhead device 10 can include two plates 30, 32 that define a lower or internal plenum 22 between them. FIG. 5 illustrates the second showerhead plate 32 shown in FIG. 4. In some embodiments, the illustrated lower or internal plenum 22 comprises hollow channels 23 forming several concentric rings on the base of the second showerhead plate 32, while the first showerhead plate 30 can be flat to cover the channels 23. In some embodiments, the inlet apertures 18 formed in the second plate 32 are between the channels 23 and thus bypass the internal plenum 22 (or channels), and align with inlet apertures 18 in the first plate 30. In the illustrated embodiment, the gas outlet apertures 20 are formed through the bottom of the channels 23. The channels 23, or internal plenum 22, connect to a pump 9, as explained above. The precursor inlet apertures 18, the exhaust apertures 20, the hollow channels 23, and the connections 25 to the pump(s) 9 can be arranged in a distributed pattern across the lower portion of the showerhead device. For example, the pattern illustrated in FIG. 5 for the reactant inlet apertures, the exhaust ports, and the hollow channels 23 is a circular pattern. One of ordinary skill in the art will appreciate that the illustrated pattern of ports may be an incomplete pattern and that the pattern can be continued around the entire base of the showerhead plate. In some embodiments, the precursor inlet ports 18, the exhaust ports 20, the hollow channels 23, and the connections 25 to the pump 9 can be arranged in similar or different patterns from each other. As shown in FIG. 5, in some embodiments, the lower portion 14 of the showerhead device 10 can have four connections 25 to the pump(s) 9 at 90 degrees to one another. In other embodiments, the lower portion 14 of showerhead device 10 can have more or fewer than four connections 25 to the pump(s) 9.

Figure 6:
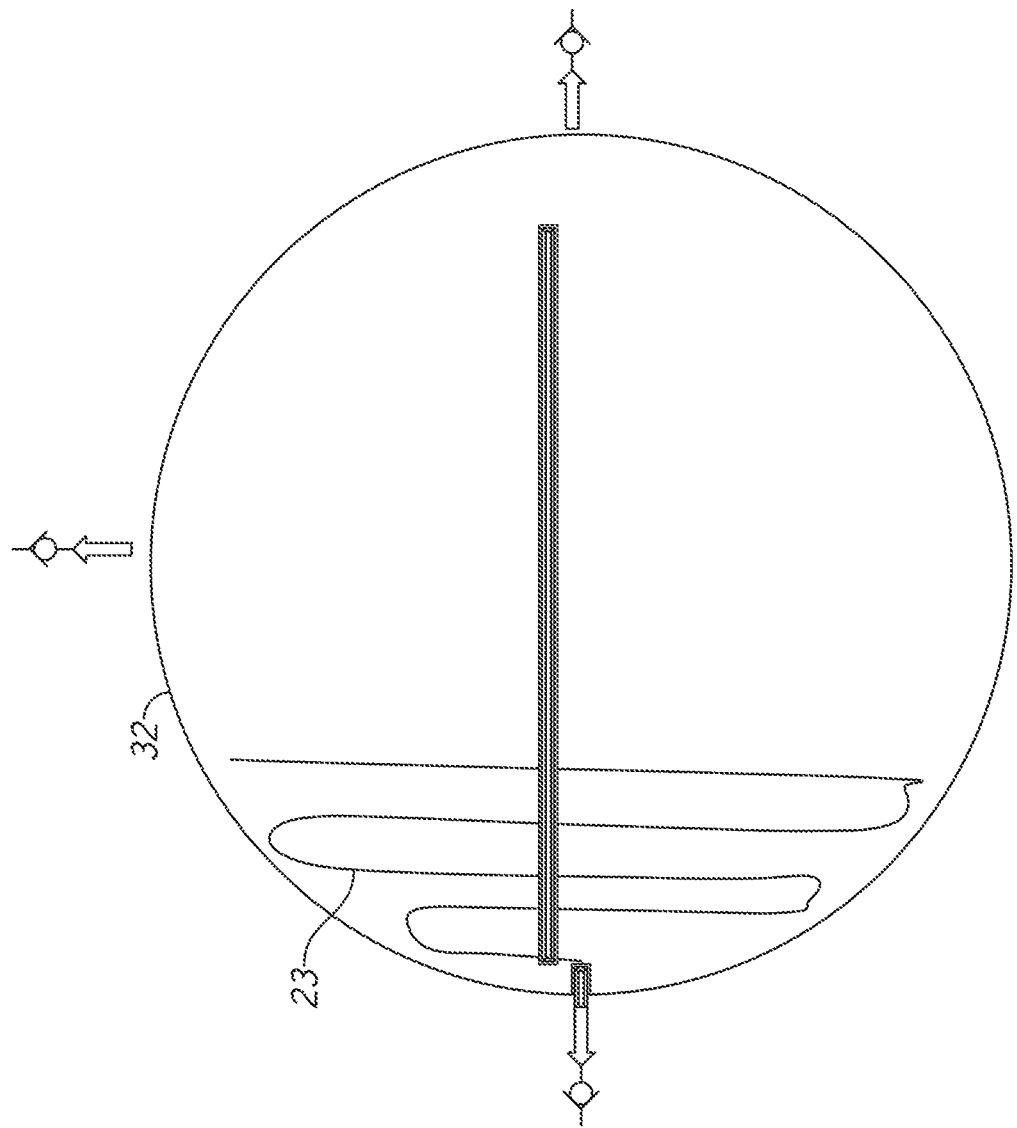
FIG. 6 illustrates an upper plan view of a second showerhead plate in accordance with some embodiments.

FIG. 6 illustrates an upper plan view of the second showerhead plate 32 of the lower portion 14 of the showerhead device 10, according to another embodiment. The second showerhead plate 32 of FIG. 6 can have channels 23 shaped in any suitable manner to define the lower or internal plenum 22. The channels 23 can take on several different shapes and patterns. For example, the hollow channel(s) 23 can be arranged in a zig-zag or labyrinth pattern as shown in FIG. 6. In some embodiments, the second showerhead plate 32 can contain multiple channels 23, with each channel 23 having a different or similar pattern. Inlet apertures 18 can be formed outside the channel(s) 23 while the exhaust apertures 20 can formed in fluid communication with the channel(s) 23, while the channel(s) 23 are connected to one or more pump(s) 9.

FIG. 7 illustrates a reactor 2 with a dual showerhead device 10, as described above, and a movable susceptor plate 50. The moveable susceptor 50 can create a reactor 2 with a dynamic reaction space. A dynamic reaction space can include adjusting the distance between the moveable susceptor plate 50 and the showerhead device 10. For example, the reaction space can be changed for every cycle, every half cycle, or periodically at any time if desired. The moveable susceptor plate 50 can be adjusted through an external motion driver unit 52. The external motion driver unit 52 can comprise an analog or digital motor, and can be mechanically and electrically connected to the moveable susceptor plate 50, whereby the external motion driver unit 52 can adjust (e.g., up and down) the moveable susceptor plate 50. With an external motion driver unit 52 connected to the apparatus 1, the gap between the wafer 6 and showerhead device 10 (or top plate, in the case of cross flow reactor,) can be changed over time, if desired. In some embodiments, the moveable susceptor plate 50 can move a distance in a range of 1 mm to 200 mm; in a range of 2 mm to 100 mm; in a range of 2 mm to 50 mm; or in a range of 3 mm to 30 mm. In some embodiments, the susceptor plate can move a distance of in a range of 0.1 mm to 50 mm; in a range of 0.1 mm to 30 mm; or in a range of 0.1 mm to 20 mm. In some embodiments, the external motion driver 52 can rotate the moveable susceptor plate 50. In various embodiments, a control system can be in electrical communication with the motor drive, the control system configured to adjust the distance between the moveable susceptor plate 50 and the showerhead device 10 during etching.

The control system can also be configured to control the processes being used in the apparatus 1. In one example of operation taking advantage of both injection and exhaust through the overhead showerhead device 10, the reactant, e.g., etchant, and the exhaust processes can be pulsed or alternated during the process for dynamic pressure control. A reactant dose can thus be divided into multiple short pulses, which can improve the distribution of the reactant molecules into the reaction chamber, facilitating rapid gas spreading by diffusion and/or pressure gradient across the substrate during each reactant or purge pulse. The switch-on and switch-off stages can repeated at least two times for the reactant. As a result, the pressure of the reaction space fluctuates rapidly between the low level and higher level pressure. The resulting pressure gradient in the reaction space during the switch-on stage pushes the precursor molecules efficiently to all areas of the reaction space, while the resulting pressure gradient in the reaction space during the switch-off stage pulls gaseous reaction by-products away from the surfaces of the reaction space to the gas outlet. If a conventional, relatively long pulse (e.g., 1 second) is released to the reaction chamber 3, the pressure is allowed to equalize, such that dynamic spreading effect is lost and the main part of the gas flow tends to head directly to the gas outlet. When several short pulses (e.g., 3 times 0.3 seconds) are released, a much more even distribution is achieved in a similar time period.

Local pressure gradients enhance the exchange of gases in the reaction space and enhance the exchange of molecules between the substrate surface and the gas phase of the reaction space. It has been found that multiple pulses of the same gas per step, whether purge step or reactant step, is particularly advantageous when processing (e.g., etching) wafers with high aspect ratio features, such as deep, narrow trenches or vias in semiconductor substrates. Thus, the process of multiple same-vapor pulses in a row, and the consequent pressure fluctuations, are particularly advantageous for etching surfaces that include vias and trenches of greater than 20:1 aspect ratio, and more particularly greater than 40:1 aspect ratio. The pressure fluctuations enable more uniform distribution and/or coverage of the surfaces within such vias and trenches in less overall time than a single prolonged pulse. Thus, overall process time (or cycle time for cyclical processing) is reduced.

One example of an etching process will now be described. During precursor A exposure, the gap between the wafer 6 and showerhead device 10 can be about 3 mm and can be optimized for delivery of reactant A. During purging, the gap between the wafer 6 and showerhead device 10 can be adjusted accordingly. During reactant B exposure time, the gap can be adjusted appropriately to deliver reactant B. The disclosed embodiment accordingly provides flexibility to each step of the process. The apparatuses described herein can be used in etching processes, including plasma etch processes. For plasma processes, the plasma sheath width, ion bombardment, residence time, plasma density, etc., can be adjusted and optimized for any step of the processes.

While certain embodiments have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present disclosure is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a sub combination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

What is claimed is:

1. A semiconductor processing apparatus, comprising:
a reaction chamber and a reaction chamber exhaust port, the reaction chamber exhaust port configured to remove vapors from the reaction chamber;
a showerhead device connected to the reaction chamber and configured to deliver reactant vapors to the reaction chamber, the showerhead device comprising:
a gas inlet configured to supply the reactant vapors into the showerhead device;
a first showerhead plate in fluid communication with the gas inlet, the first showerhead plate comprising a plurality of openings;
a plenum disposed between the gas inlet and the first showerhead plate, the plenum configured to convey vapors from the gas inlet to the plurality of openings; and
a second showerhead plate comprising:
a plurality of inlet ports in fluid communication with the plurality of openings, the plurality of inlet ports configured to deliver the reactant vapors to the reaction chamber; and
a plurality of outlet apertures configured to remove vapors from the reaction chamber; and
one or more pumps connected to the reaction chamber exhaust port and the plurality of outlet apertures, the one or more pumps configured to remove vapors from the reaction chamber through the reaction chamber exhaust port and the plurality of outlet apertures;
wherein the first and second showerhead plates cooperate to define a channel in fluid communication with the plurality of outlet apertures and the one or more pumps;
wherein the showerhead device comprises an upper portion and a lower portion separated by the plenum, the upper portion comprising a second plurality of openings and the lower portion comprising the first and second showerhead plates.

2. The semiconductor processing apparatus of claim 1, wherein the one or more pumps comprises a plurality of pumps.

3. The semiconductor processing apparatus of claim 1, further comprising a susceptor within the reaction chamber facing the showerhead device.

4. The semiconductor processing apparatus of claim 3, further comprising a motor drive connected to the susceptor, the motor drive configured to adjust the distance between the susceptor and the showerhead device.

5. The semiconductor processing apparatus of claim 4, further comprising a control system in electrical communication with the motor drive, the control system configured to adjust the distance between the susceptor and the showerhead device during etching.

6. The semiconductor processing apparatus of claim 1, wherein the plurality of inlet ports bypasses the channel.

7. The semiconductor processing apparatus of claim 1, wherein the channel forms a zig-zag pattern.

8. The semiconductor processing apparatus of claim 1, wherein the plurality of outlet apertures are located along concentric rings on the second plate.

9. The semiconductor processing apparatus of claim 1, wherein the gas inlet comprises a plurality of branched inlet lines that deliver the reactant vapors to the first showerhead plate.

10. The semiconductor processing apparatus of claim 1, further comprising a control system configured to deliver an etch reactant from an etch reactant source to the reaction chamber.

11. The semiconductor processing apparatus of claim 10, further comprising the etch reactant source in fluid communication with the first showerhead plate.

12. The semiconductor processing apparatus of claim 11, wherein the control system is configured to deliver the etch reactant to a substrate conformally such that etch conformality is greater than 50%.

13. The semiconductor processing apparatus of claim 11, wherein the control system is configured to deliver the etch reactant to a substrate selectively such that the etch selectivity is greater than 10%.

14. A semiconductor processing apparatus, comprising:
a reaction chamber;
a reaction chamber exhaust port configured to remove vapors from the reaction chamber; and
a showerhead device comprising:
a plurality of distributed inlet apertures in fluid communication with a reaction vapor source and the reaction chamber;
a gas inlet configured to supply reactant vapors into the showerhead device;
a plenum disposed between the gas inlet and the inlet apertures, the plenum configured to convey vapors from the gas inlet to the inlet apertures; and
a plurality of distributed exhaust apertures in fluid communication with a pump and the reaction chamber, the plurality of distributed exhaust apertures configured to remove vapors from the reaction chamber;
wherein the showerhead device comprises an upper portion and a lower portion separated by the plenum;
wherein the showerhead device comprises a first showerhead plate disposed over a second showerhead plate;
wherein the lower portion of the showerhead device comprises the first and second showerhead plates, and the upper portion comprises a second plurality of exhaust apertures;
wherein the first and second showerhead plates cooperate to define a channel in fluid communication with the plurality of exhaust apertures and the pump.

15. The semiconductor processing apparatus of claim 14, wherein the first showerhead plate includes a plurality of inlet openings, and wherein the second showerhead plate includes a plurality of inlet ports and a plurality of exhaust ports.

16. The semiconductor processing apparatus of claim 14, further comprising a gas inlet including a plurality of branched gas inlet lines to deliver vapors to the showerhead device.

17. A semiconductor processing apparatus, comprising:
a reaction chamber; and
a showerhead device comprising:
a gas inlet configured to supply reactant vapors into the showerhead device;
an internal plenum communicating with a pump;
a plurality of exhaust apertures in fluid communication with the internal plenum and the reaction chamber, the plurality of exhaust apertures configured to remove vapors from the reaction chamber;
a plurality of inlet apertures in fluid communication with a reaction vapor source and the reaction chamber, the inlet apertures extending through the showerhead device and bypassing the internal plenum, the inlet apertures in fluid communication with an upper plenum, and the upper plenum disposed between the gas inlet and the showerhead device;

wherein the internal plenum comprises a zig-zag pattern;

wherein the showerhead device comprises two showerhead plates, and the zig-zag pattern is defined by a groove in one of the plates that is covered by the other of the plates.

18. The semiconductor processing apparatus of claim 17, further comprising a reaction chamber exhaust port.

19. The semiconductor processing apparatus of claim 17, further comprising one or more pumps in fluid communication with the plurality of exhaust apertures.

20. The semiconductor processing apparatus of claim 1, further comprising an inlet manifold, the inlet manifold disposed between the gas inlet and the plenum.

* * * * *